United States Patent [19]

Thornton et al.

[11] 4,397,074
[45] Aug. 9, 1983

[54] METHOD OF FORMING A GANG CUTTING TOOL ASSEMBLY AND TOOL FORMED THEREBY

[75] Inventors: Henry M. Thornton; John S. Thornton, both of York, Pa.

[73] Assignee: Ashcombe Products Company, Dover, Pa.

[21] Appl. No.: 231,340

[22] Filed: Feb. 4, 1981

[51] Int. Cl.³ ............................................. B23P 23/02
[52] U.S. Cl. ......................................... 29/564; 408/3; 409/125; 409/130
[58] Field of Search .............. 29/26 A, 564, 563, 56.5; 408/241 R, 3; 364/474, 475, 900; 409/130, 125

[56] References Cited

U.S. PATENT DOCUMENTS

| 2,215,273 | 9/1940 | Paradis | 408/42 |
| 2,625,846 | 1/1953 | Hess | 408/241 R X |
| 2,955,490 | 10/1960 | Hess | 408/3 |
| 2,975,661 | 3/1961 | Coleman | 408/3 |
| 3,025,728 | 3/1962 | Cross et al. | 408/6 |
| 3,163,057 | 12/1964 | Drummond et al. | 408/3 |
| 3,310,796 | 3/1967 | Sanders | 340/671 |
| 3,381,550 | 5/1968 | Smith | 408/16 |
| 3,532,893 | 10/1970 | Marantette et al. | 408/3 |
| 3,627,437 | 12/1971 | Smith | 408/16 |
| 3,635,570 | 1/1972 | DeGelleke et al. | 408/43 |
| 3,663,114 | 5/1972 | Welsh et al. | 408/3 |
| 3,669,557 | 6/1972 | Mitchell | 408/16 |
| 3,747,085 | 7/1973 | Bala et al. | 340/680 |
| 3,765,787 | 10/1973 | Hart et al. | 408/53 |
| 3,793,625 | 2/1974 | Pomella | 364/900 |
| 3,822,958 | 7/1974 | Lewis | 408/46 |
| 3,918,145 | 11/1975 | Oglivie | 29/564 |
| 4,090,803 | 5/1978 | Haley | 408/46 |
| 4,280,775 | 7/1981 | Wood | 408/3 |

FOREIGN PATENT DOCUMENTS

2073912 10/1981 United Kingdom ................. 29/564

Primary Examiner—William R. Briggs
Attorney, Agent, or Firm—C. Hercus Just

[57] ABSTRACT

A gang tool assembly for drilling a precise pattern of holes in a workpiece or otherwise cutting surfaces and the like on such workpiece and including a mounting panel of rigid sheet material having a pattern of holes formed therein to receive supports for powered tool heads to detachably support the same to form a gang pattern of either drills or cutters for simultaneously drilling a pattern of holes in a workpiece or forming a contoured surface thereon. The mounting panel is formed by at least pricking with pins a pattern of holes upon a sheet-like pattern of all holes to be drilled and forming partial patterns of the entire pattern separately upon said sheet-like pattern and digitizing the same upon a tape for use in a numerically controlled machine operable to successively drill a series of rigid sheet-like support plates for holding powered drill heads in partial patterns of said entire pattern and comprising a set thereof for use to drill patterns of holes in sets of test and base plates respectively requiring holes of different diameters for use in ultimately drilling holes in prodcut sheet material having the entire required pattern of holes therein.

3 Claims, 15 Drawing Figures

METHOD OF FORMING A GANG CUTTING TOOL ASSEMBLY AND TOOL FORMED THEREBY

BACKGROUND OF THE INVENTION

To a certain extent, the present invention was inspired by attempting to solve the problem of drilling multiple holes in printed circuit boards which, even in small sizes, frequently have a very substantial number of holes of varying diameters drilled in precise patterns therein for purposes of receiving connecting pins, contacts or wires on various electrical components which are integrally fixed to the printed circuit on the board by soldering. Drilling such a multiplicity of holes has heretofore been a very time-consuming operation, the crudest methods comprising individually drilling said holes by a single drill mounted either in a drill press or in a numerically controlled drilling machine having a limited number of variably movable drill heads. The close relationship of said holes in such circuit boards renders the drilling thereof by automatic means very difficult in view of the need to simultaneously operate a plurality of drills in a precise pattern without conflict between the various drills which must be powered, and also sometimes requiring the changing of drill bits to form a plurality of diameters occassionally required.

It has been the practice in certain manufacturing operations to operate a multiplicity of drills by various power means where the close proximity of the holes drilled thereby is not as acute as found in the drilling of holes in printed circuit boards. For example, in drilling spaced holes in ladder rails for receiving the ends of the rungs of the ladder by means of a gang of drills is well-known and providing power means to operate such drills simultaneously is readily solved by gear trains, chains, or otherwise. Further, gang drilling machines which have adjustable mounts for the drills to accommodate the same to different patterns also are known, and examples of these are included among the following patents, which are typical of mechanically-operated drilling machines in which the drills are operated by gears or otherwise, as referred to above:

U.S. Pat. No. 2,215,273—Paradis—Sept. 17, 1940
U.S. Pat. No. 3,635,570—DeGelleke et al.—Jan. 18, 1972
U.S. Pat. No. 3,765,787—Hart et al.—Oct. 16, 1973
U.S. Pat. No. 3,822,958—Lewis—July 9, 1974
U.S. Pat. No. 4,090,803—Haley—May 23, 1978

Another problem existing in the operation of gang drills comprises detecting either malfunctioning individual drills or broken drill bits, especially when mass production is involved, and efforts have been heretofore to provide various types of detecting means for such broken bits or malfunctioning power means, and typical examples of such devices are illustrated in the following patents:

U.S. Pat. No. 3,025,728—Cross et al.—Mar. 20, 1962
U.S. Pat. No. 3,310,796—Sanders—Mar. 21, 1967
U.S. Pat. No. 3,381,550—Smith—May 7, 1968
U.S. Pat. No. 3,627,437—Smith—Dec. 14, 1941
U.S. Pat. No. 3,669,557—Mitchell—June 13, 1972
U.S. Pat. No. 3,747,085—Bala et al.—July 17, 1973

Forming a support means for a multiplicity of drills also has been a problem requiring attention heretofore but especially where the proximity of the holes to be drilled is not acute, compared to drilling of holes in printed circuit boards, it has not been particularly difficult to devise supports and mounting means for a plurality of drill shanks or chucks, but especially where drill holes are in very close proximity, as in printed circuit boards, some means for forming a support for a plurality of preferably small size power heads has given rise to the investigation of employing suitable means and methods for forming such support means of rigid sheet-like type and investigations of suitable solutions for providing such support means comprises the subject matter of the present invention. In this, as described in greater detail hereinafter, the basic support plate is formed by drilling in a set of similar sizes and shapes of rigid sheet material, such as metal or plastic, partial patterns of holes comprising parts of a complete pattern of holes to provide support for powered drill heads positioned on said plates in a manner not to conflict with each other and operable successively upon product sheet material to form a desired complete pattern of holes therein.

SUMMARY OF THE INVENTION

It is among the principal objects of the present invention to provide a gang drill assembly for drilling a precise pattern of holes in product sheet of material in which the holes may be of various diameters and also very closely spaced from each other, one typical commercial example of which comprises printed circuit boards. Said assembly includes a set of rigid support plates in which partial patterns of an entire pattern of holes are formed respectively to receive supports for powered drill heads to detachably support the same and thereby form a gang pattern of cutting drills for simultaneously drilling a desired complete pattern of holes in product sheet material, such as, for example, printed circuit boards.

Another object of the invention is to form said set of support plates by using a diagram or pattern sheet on which the entire pattern of holes is shown and either pricking or inserting in selected holes of said pattern plugs having sharp points and heads, the heads being substantially equal in diameter to powered drill heads to be attached to said support plates, and recording the positions of said pricks or plugs upon a tape for use in a numerically-controlled drilling machine to drill an entire set by such recordings respectively in a set of rigid support plates and additional base and inspection plates respectively for supporting and testing drilled product sheets of material formed by using said set of support plates with drill heads attached thereto as gang drill assemblies, ultimately to form a complete identical pattern of holes in said product sheets.

A further object of the invention is to provide between the operation of each gang drill assembly of said aforementioned set thereof, detecting probes or the like, arranged in a pattern identical with that of the pattern of drills on said gang drill assembly with which it is associated in operation so that by inserting said probes in the drilled holes, any holes which have not been properly drilled readily will be detected and appropriate signal means actuated to call attention to such improper drilling, such as resulting from a borken drill bit or the like.

Still another object of the invention is to provide detecting means for a malfunctioning power unit which, for example, though not restricted thereto, may respond to sound, and such detecting means individually are associated with each power head and connected in circuit with audible and/or visible indicating means to call attention to such malfunctioning of the power head.

A still further object of the invention is to provide a system whereby said set of gang drill assemblies interspersed with detecting means may be used to completely drill all required holes in a product sheet of material, such as described hereinabove.

Still another object of the invention is to arrange a gang drill assembly in which a pattern of drills and power heads are arranged to perform other functions than merely drilling holes, such as by operating in unison in a certain pattern to function in a planing or milling operation and/or in a circular pattern for cutting annular grooves or cutting discs from a sheet of material, and otherwise.

Details of the foregoing objects and of the invention, as well as other objects thereof, are set forth in the following specification and illustrated in the accompanying drawings comprising a part thereof.

DETAILED DESCRIPTION OF THE PREFERRED EMBODIMENTS

As indicated above, development of the present invention was at least partially inspired by attempting to solve the problem of drilling holes in a printed circuit board but the invention is not to be restricted simply to this function since a multiplicity of drill heads, having cutting bits therein, and made in accordance with the present invention, have application in other operations and functions described in detail hereinafter.

Figure 1:
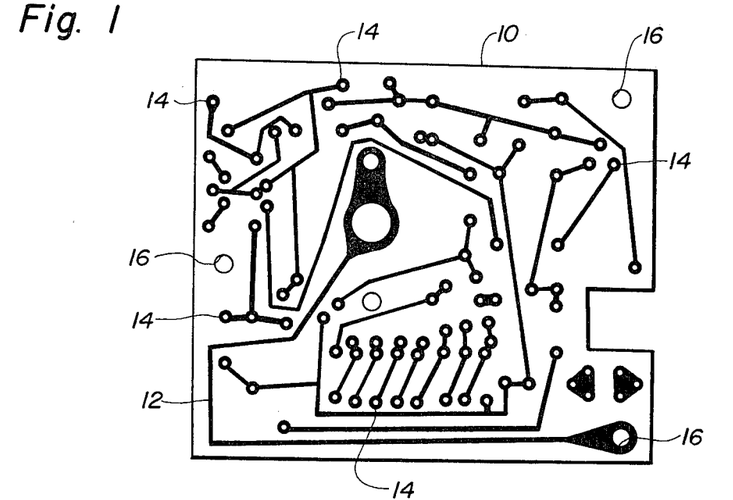
FIG. 1 is a plan view of a typical printed circuit board in which a plurality of holes are shown in elements of the circuit illustrated thereon.

Referring to FIG. 1, a typical plan view of a printed circuit board is shown in which a sheet of stiff insulating board material 10 is shown upon which a pattern of an electric circuit of "printed" metal 12 is shown in black and being representative of one type of product sheet material adapted to be formed by the present invention. By processes not involved in the present invention, the metallic electric circuit of printed circuit boards is applied to the insulating board 10 and firmly adheres thereto. The board also has a multiplicity of holes 14 of small diameter drilled therein in the center of enlarged metallic areas forming an integral part of the electrical circuit and to which various wire-type leads or contacts of different types of electrical components are connected by extending through said holes and then being integrally attached to the circuit 12 by means of solder.

Figure 2:
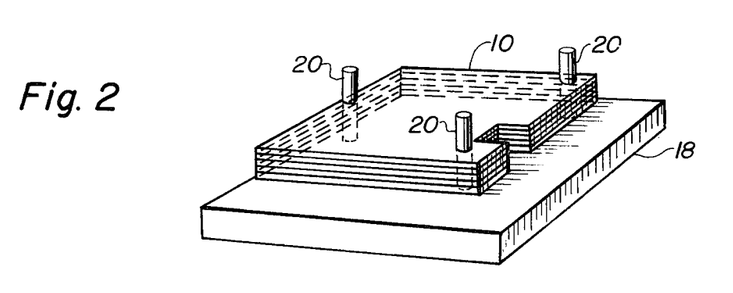
FIG. 2 is a perspective view of an exemplary set of printed circuit boards mounted upon a base plate in flately stacked manner with respect to aligning pins.

For purposes of orienting individual circuit boards or other sheet type products incident to drilling, for example, a limited number thereof simultaneously by means embodying the present invention, as described in detail hereinafter, each board or product is also provided with positioning holes 16, which are identical in each one. Referring to FIG. 2, there is illustrated therein a holding or base plate 18 for use in an overall machine system, described hereinafter, which is utilized to support a plurality of the exemplary boards 10 in stacked relationship upon guide and positioning pins 20, which are rigidly connected to and extend upward from the top surface of plate 18 to project through the holes 16 in the circuit boards 10.

As also referred to hereinabove, one of the principal objects of the present invention is to form a very rigid supporting panel for a plurality of drill heads and/or testing heads or the like, said panel preferably being formed from sheet metal or plastic material of suitable thickness to remain rigid in use to support powered drill heads and the like.

Figure 3:
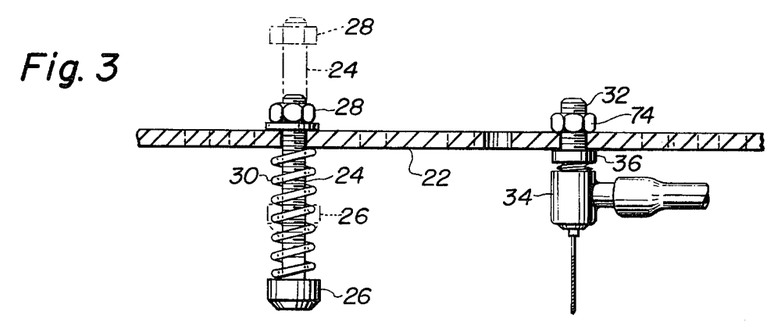
FIG. 3 is a fragmentary section of an exemplary rigid support plate made in accordance with the invention and showing respectively, in sectional manner, a pressure element reciprocably mounted therein, and a powered drill head supported by a shaft mounted in an opening in said support plate.

Referring to FIG. 3, there is illustrated therein, typical devices supported by the rigid support plate 22, which is shown fragmentarily and preferably is of uniform thickness of sheet metal or plastic material. In the left-hand portion of plate 22, there is illustrated a shaft slidable in a bearing hole in the plate comprising a pressure member 24 having a presser foot on the lower end and a movement-limiting adjustable nut 28 on the upper end. A compressible spring 30 surrounds shaft 24 between the lower surface of support plate 22 and presser foot 26, whereby when drill bits or test probes, described in detail hereinafter, are withdrawn from the sheet-like product circuit boards 10, the presser feet 26 engage either a single or the uppermost of a stack of product boards 10 to hold the same against base plates 18 and thereby not disturb the same relative to positioning pins 20. Feet 26 also hold plates 10 flat while being drilled.

One of the highly important devices to be supported respectively by supporting shafts 32 comprise powered drill heads 34. Said shafts extend through holes of a partial pattern of the entire desired pattern of holes to be drilled in boards 10 and are provided with a flange 36 which abuts the lower surface of support plate 22, and suitable means, such as a nut 38, clamp the shafts to the plate 22. A powered drill head 34 is firmly connected to the lower end of the shaft 32, which, as will be described hereinafter, is one of a number thereof attached to each support plate 22 of a set thereof respectively having a partial pattern of powered drill heads 34 thereon adapted sequentially to drill a full desired pattern of holes in the product boards 10.

Figure 4:
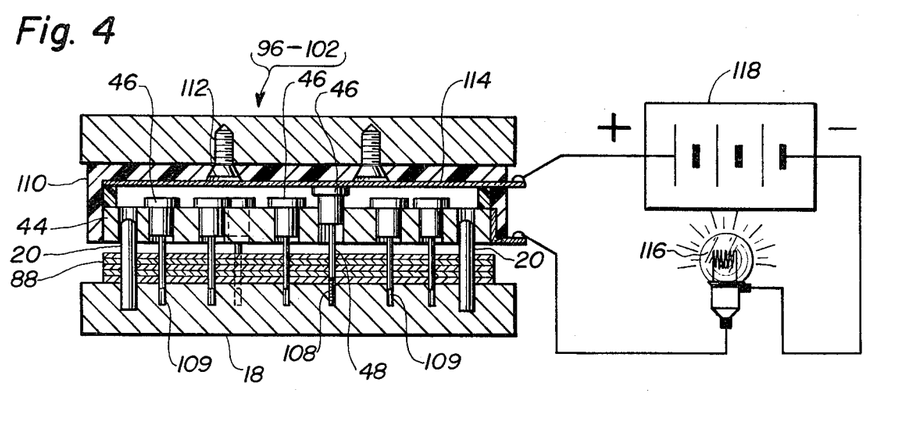
FIG. 4 is a vertical sectional view of indicating mechanism for detecting improperly drilled holes in a stack of printed circuit boards, and also showing exemplary indicating means.

It also is to be understood that, in accordance with the present invention, there are detecting heads 46 mounted on separate support plates 44, one of which is shown in FIG. 4, which is different from that which supports the drill heads 40 but the patterns of the holes in the respective panels in which they are mounted are the same for purposes respectively of sequentially drilling a desired pattern of holes in product sheets of material, such as the printed circuit boards 10 and, immediately thereafter, checking the drilled holes to determine the completeness of said drilling or the existence of one or more broken or loose drill bits or the like, which situation is detected by the probes 48, for example.

Figures 5, 6:
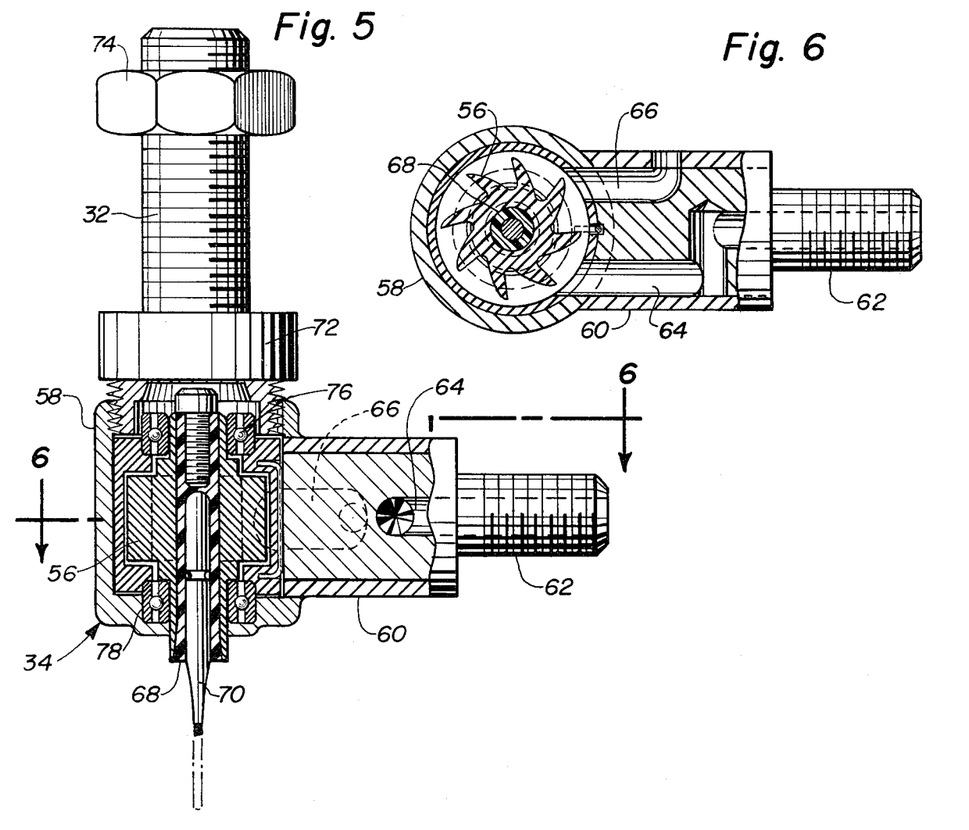
FIG. 5 is a vertical sectional view of a powered drill head embodying a fluid-operated turbine connected to a supporting shaft mounted in a sheet of material or support means as a panel shown in FIG. 3.
FIG. 6 is a horizontal sectional view of the powered drill head shown in FIG. 5, as seen on the line 6—6 thereof.

Although other types of powered drill heads than the one specifically illustrated in FIGS. 5 and 6 may be employed to effect gang drilling of a pattern of holes in a product sheet of material, such as a printed circuit board, it is essential that for purposes of space economy in forming a given set of gang drill assemblies and corresponding detecting assemblies, that as many drill heads as possible be mounted without conflict with each other on any individual gang drilling assembly of a set thereof. For this purpose, it is preferred that the powered drill heads be of minature nature, especially where the holes 14 in a specific pattern thereof in a product, such as a circuit board 10, are arranged in very close proximity.

In view of the foregoing, the type of power head selected preferably for drilling holes in accordance with the principles of the present invention, comprises an air-driven turbine 56 of minature type, rotatably supported by anti-friction bearings within a cylindrical housing 58. For more complete details of the type of drill head which is preferred, attention is directed to prior U.S. Pat. No. 3,077,333 to Gotwald et al, dated Feb. 12, 1963. The fluid for operating the turbine is preferably air or other convenient type of gas delivered under pressure through a lateral neck 60 which terminates in a connecting nozzle 62 to which a suitable, preferably flexible, air conduit is connected and the opposite end thereof is connected to a suitable source of air under pressure, not shown.

As shown in FIG. 6, the neck 60 is provided with an air inlet port 64, which extends outwardly through the nozzle 62 and an exhaust port 66 is also formed in the neck 60 for immediate discharge of spent air from the turbine 56. The shaft of turbine 56 contains an appropriate chuck 68, which supports a cutting bit or drill 70, as clearly shown in FIG. 5.

The shafts 32 for supporting the drill heads 34 are shown in greater detail and in larger scale in FIG. 5, than otherwise shown in FIG. 3, and it will be seen that the shafts 32 terminate at the lower end thereof in an annular shoulder 72, which abuts the lower surface of the support plates 22 when assemblying the required quota of drill heads upon said plate and the upper ends of the shafts 32 are threaded to receive the nuts 74 and thereby firmly secure the shafts 32 to the support plates 22. If desired, shafts 32 may be tubular and thereby afford an additional air exhaust passage to accommodate air discharged from the vanes of the turbine 56 through the upper anti-friction bearing 76 for purposes of lubricating and/or cooling the same during operation. Similarly, there is clearance in the bottom wall of the housing 58 through which the lower end of the turbine shaft extends to permit the discharge of air therethrough after it has passed through the lower anti-friction bearing 78.

Figure 13:
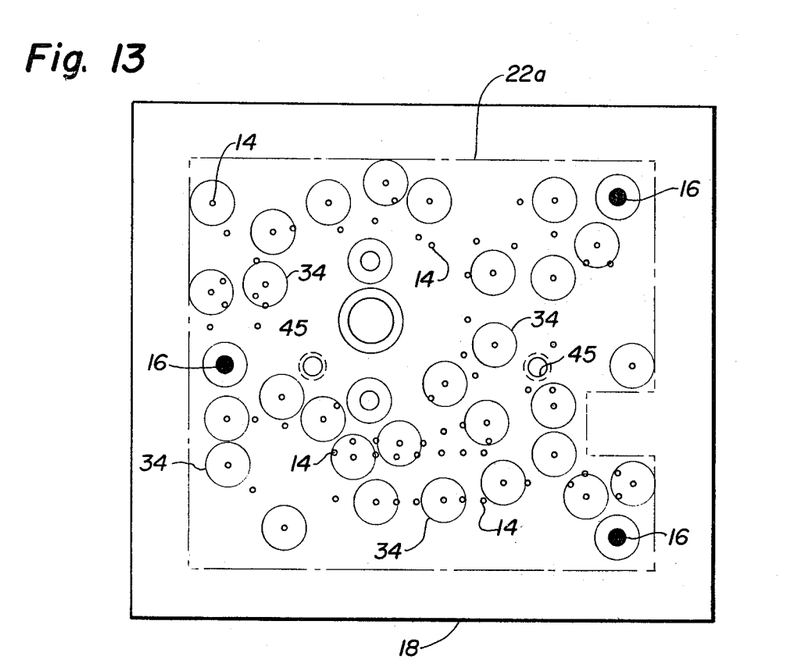
FIGS. 13 and 14 respectively show exemplary drill head patterns in a related pair of panels of a set thereof adapted to be successively operated upon a stack of printed circuit boards incident to completely drilling a desired pattern of holes therein.
Figure 14:
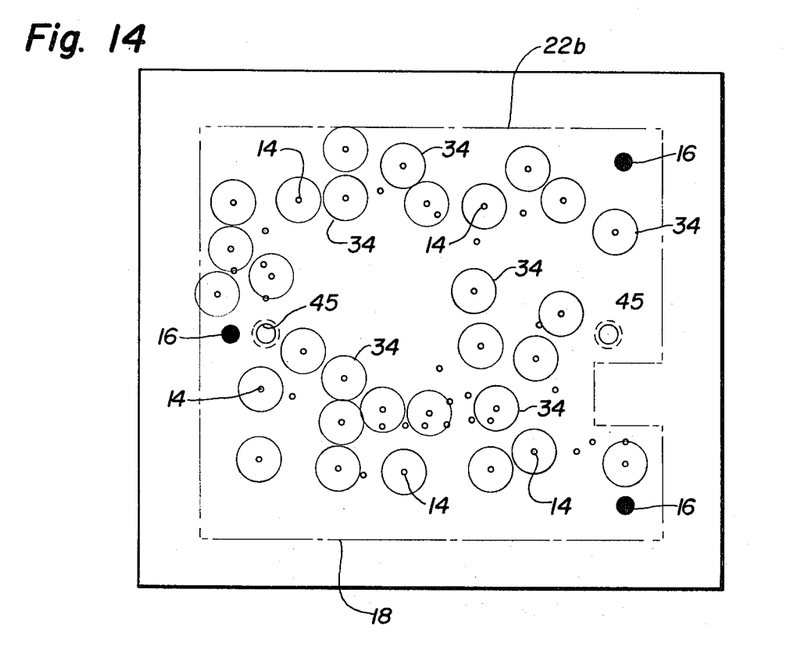

Referring to FIGS. 13 and 14, there is illustrated two exemplary different support plates 22a and 22b, comprising parts of a complete set of coordinated patterns which supplement each other so that in the aggregate, after each of the support plates with the pattern of powered drill heads mounted thereon have completed drilling, for example, a limited stack of identical products, such as printed circuit boards, all of the holes in said boards of a complete pattern thereof, will have been drilled. As shown in FIGS. 13 and 14, the exemplary pattern of holes 14 is shown in the form of tiny circles that represent most of the entire number of holes shown in the board 10 in FIG. 1, such illustrations comprise an arrangement of circles representing diagrammatically illustrated drill heads 34 in which none of them conflict with each other, and therefore, are capable of being mounted in individual cooperative patterns respectively in the support plates 22 of a complete set thereof. Accordingly, by orienting all of the patterns of drill heads 34 with respect to the positioning holes 16, which, in turn, also orient a stack of the product printed circuit boards 10 with respect to the positioning pins 20, as shown in FIG. 2, it is possible to accurately drill an entire complement of holes in a printed circuit board having a desired pattern of holes to be formed therein. Holes 45 are formed to receive attaching bolts or the like to secure devices, such as supporting brackets, to the support plates 22.

Another consideration to be observed is that, in view of the fact that the preferred type of powered drill heads 34 are of the air turbine type, space must be provided for connecting air or gas delivery hoses to the neck 60 of each drill head 34, and it can be visualized from the pattern of drill heads in FIGS. 13 and 14 that such arrangement is possible.

Figure 15:
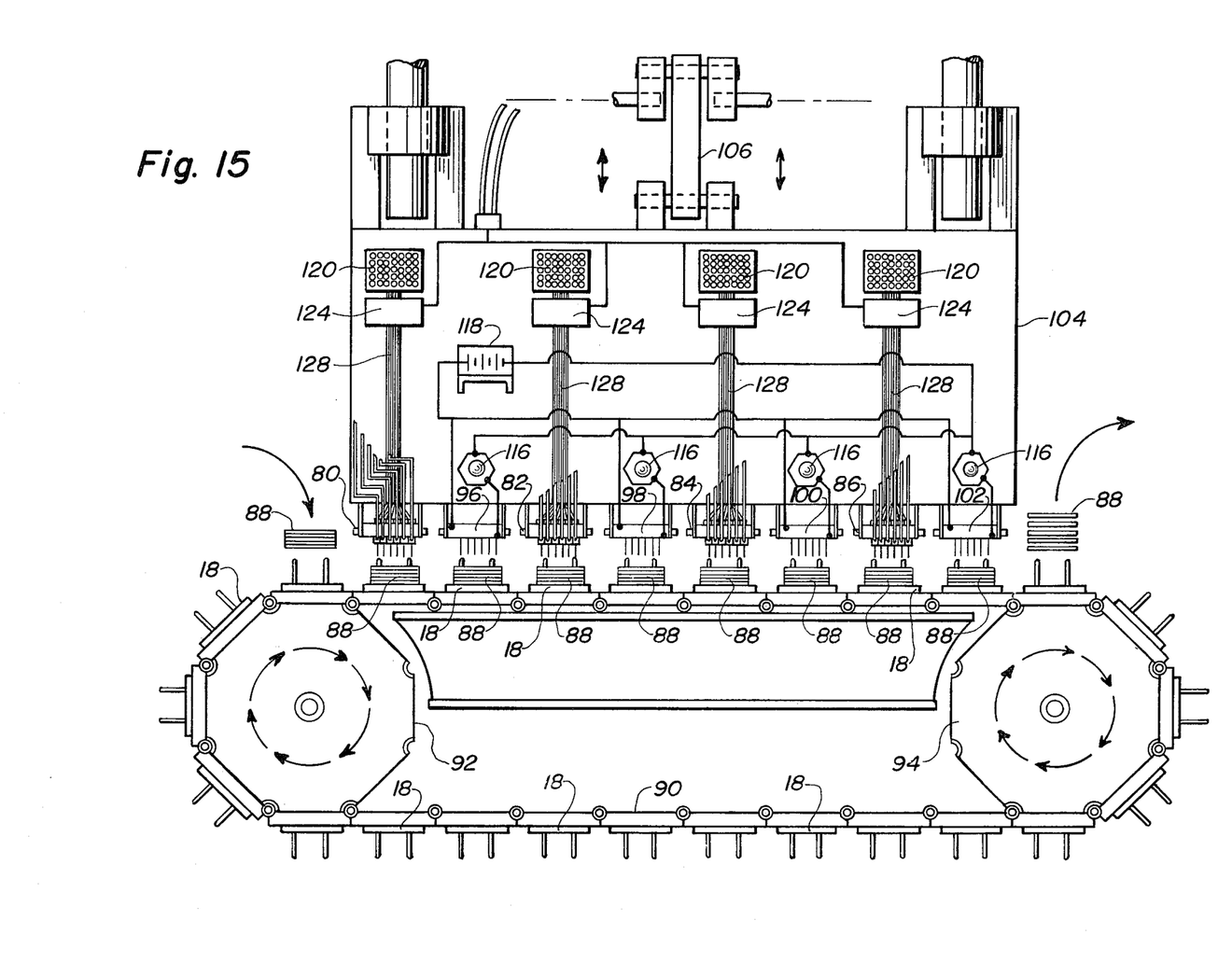
FIG. 15 is a vertical elevation showing a machine system for drilling holes in electronic printed circuit boards and embodying a series of successively operated gang drill assemblies, each respectively drilling a partial pattern of holes comprising a portion of an overall pattern of holes to be drilled in sets of printed circuit boards and also including means to detect and signal incompletely drilled holes and additional means to detect and indicate malfunctioning drill heads.

Attention is now directed to FIG. 15, in which there is illustrated an exemplary machine system for utilizing each of the individual gang drill assemblies 80, 82, 84 and 86, comprising an exemplary set thereof, adequate to completely drill all of the required holes in a specific example of sheet product, such as printed circuit boards. Said assemblies respectively include individual support plates 22, each having a given complement of a partial pattern of drill heads 34 mounted thereon in cooperative patterns jointly and sequentially capable of providing the full complement of holes to be drilled in stacks 88 of blank product printed circuit boards 10, the exemplary stack thereof nearest the left-hand end of FIG. 15 being completely undrilled. An endless conveyor 90 extends around a pair of rotatable supporting drums 92 and 94, one of which is driven by a suitable source of power, not shown, in stepwise manner, sequentially to advance the stacks 88 of the circuit boards respectively to the gang drill assemblies and also to the intermediate testing head assemblies 96, 98, 100 and 102, which, like the gang drill assemblies 80–86, are commonly attached to the lower surface of a reciprocatory frame 104, clearly illustrated in FIG. 15.

The testing head assemblies 96-102 each preferably comprise a support plate 44 which are similar to plates 22, illustrated with respect to the gang drill assemblies 80-86, but may be thicker, if desired. As stated, the conveyor 90 is advanced stepwise to successively introduce to said gang drill assemblies each of the base plates 18, which are detachably connected accurately to each equally spaced links of the endless flexible conveyor 90, as clearly shown in FIG. 15. By suitable control means for operating the motor which advances the conveyor 90, such as by rotation of the drum 94 in the direction of the arrows shown thereon, each of the stacks 88 of circuit boards are very accurately positioned successively for vertical reciprocation of frame 104 that carries all of the gang drill assemblies 80-86 and testing head assemblies 96-102 so that when the stacks 88 of circuit boards emerge at the right-hand end of the path traversed thereby, as shown in FIG. 15, any suitable means may be employed to remove the completely drilled stack 88 successively from the holding or base plates 18.

A number of commercially available, automatically controlled devices are capable of reciprocating the frame 104, one well-known commercial example of which comprises lead screws, a complement of ballnuts, a stepping motor and the like, manufactured and sold by Warner Electric Brake and Clutch Co., and capable of being operated in controlled manner for reciprocation of the frame 104 in a desired cycle of adequate vertical movements within a suitable time schedule. For example, the frame 104 may be reciprocated stepwise and successively retracted after each step, having in mind that in view of the very small diameter of holes usually employed in printed circuit boards, the drills employed to form such holes are highly susceptible to breakage if applied steadily in drilling manner to a workpiece for any sustained period of time. Therefore, by reciprocating each gang drill assembly in successive steps in which each step drills, for example, only a single circuit board, it can be seen that if a stack of four circuit boards are to be drilled, four reciprocations of the drill assembly are made, each step descending an additional amount equivalent to the thickness of a circuit board, until all of the circuit boards have been drilled.

In FIG. 15, exemplary actuating means 106 is illustrated to symbolize suitable means to reciprocate the frame 104, either of the exemplary type described above, or any other actuating mechanism, which preferably will provide a step-type reciprocation for purposes of minimizing breakage of drill bits or milling cutters, said reciprocation being indicated by suitable arrows in the upper portion of FIG. 15.

TESTING MECHANISM

Especially in view of the fact that drilling holes of a small diameter in workpieces, such as printed circuit boards or otherwise, involves the use of very small diameter drill bits, breakage of the same is not uncommon. The stepwise reciprocation thereof referred to above tends to minimize such breakage. However, especially in mass production of drilled printed circuit boards, which is one type of sheet product, contemplated for production by the exemplary equipment and system illustrated in FIG. 15, it is preferred and actually is essential that testing of the drilled workpieces be performed in a manner automatically to indicate the existence of incompletely drilled holes, for example, which usually will indicate the existence of a loose or broken drill bit, whereupon the operation of the machine may be stopped and the broken bit can be replaced, after which operation of the machine is continued.

One exemplary form of testing equipment for use with a stack of products of sheet material of which printed circuit boards are an example, comprises short shafts or heads 46, exemplary illustrations of which are included in FIG. 4, said shafts or heads being mounted for limited reciprocation relative to support plate 44 and each supporting a probe 48, for example, of an appropriate diameter to easily descend within holes drilled in the stacks 88 of circuit boards 10, for example. In FIG. 4 there also is illustrated a vertically sectioned exemplary assembly, showing a base plate 18 upon which a stack 88 of drilled circuit boards is supported in conjunction with one of the testing head assemblies 96-102. The support plate 44 supports a complement of short shafts or detecting heads 46 arranged in a partial pattern corresponding to such partial patterns of holes 14 in support plates 22 and each partial pattern is identical with a corresponding partial pattern of drill heads immediately upstream from the exemplary testing head assembly 96-102, shown in FIG. 4.

An exemplary drill bit fragment 108 is illustrated in one of the holes drilled in the stack 88 of exemplary circuit boards, said fragment being disposed in one of the shallow holes 109 provided in the holding plate 18 in order that the drill bits 70 may drill entirely through the stack 88. The set up for drilling the holes by a numerically controlled machine in the support plates 22, for example, to accommodate the shafts 24 and 32, also may be used to drill the shallow holes 109 but using smaller diameter drill bits than for drilling the holes for shafts 24 and 32. The fragment 108 extends up into at least the lowermost circuit board in the stack 88, by way of example, whereby when the probe 48 engages the fragment 108, it will raise the detecting head 46, as illustrated in exemplary manner in FIG. 4.

Preferably, the detecting heads 46 are metallic and the support plate 44 also is metallic, as shown in FIG. 4. Support plate 44 is insulated from the testing head assemblies 96-102 by an electrical insulating frame 110, which supports the support plate 44 and is secured to said testing head assemblies 96-102 by any suitable means, such as screws 112. A metallic contact sheet 114 extends along the lower interior surface of insulating frame 110. Exemplary indicating means in the form of an electric lamp bulb 116 is supported in circuit with an exemplary electrical source 118, said circuit also respectively being connected in series with contact sheet 114 and the metallic support plate 44 as illustrated adjacent the right-hand end of the illustration shown in FIG. 4. When the displaced detecting head 46 engages the contact sheet 114, the bulb 116 will be lighted to constitute a signal that a broken drill bit exists. Other forms of signals, visual or audible, may be used.

If desired, a more elaborate detecting system may be provided, as explained hereinafter, so that in addition to merely indicating the existence of a broken drill bit, the location of such drill bit in the pattern thereof, also may be indicated.

Figure 7:
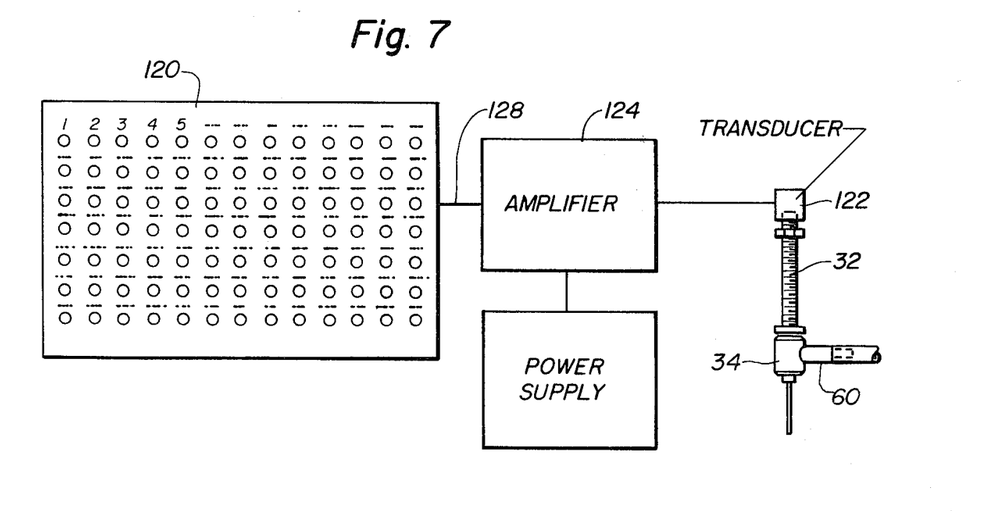
FIG. 7 is a diagram showing indicating and detecting means for a malfunctioning drill head.

Referring to FIG. 7, there is illustrated therein a signal board 120, which includes a plurality of minute signal lights, for example, associated with numerical indicia to indicate the location of a malfunctioning drill head 34, one of which is shown in FIG. 7, supported on the lower end of its mounting shaft 32, which, it will be understood, is supported in one of the support plates 22. A sound-responsive transducer 122, such as the type used in phonograph pickup heads, for example, is mounted on the upper end of each of the shafts 32, so as to be responsive to sound generated by drill heads 34.

When, for example, the bearing 76 or 78 of one of the air turbine-type drill heads 34 becomes worn beyond a desirable limit, a modified sound will be produced by such a drill head and the transducer 122 is of the type which will be responsive to such modified sound and transmit the same to an amplifier 124, which is connected in circuit with a power supply 126, for purposes of transmitting current to an individual signal light in the signal board 120, corresponding to the malfunctioning drill head 34, it being understood that there is a circuit between each transducer and its corresponding signal light in the signal board 120. A cluster 128 of conducting wires, illustrated in exemplary manner in FIG. 15, extends between the drill heads 34 of each gang drill assembly 80-86, and the respective signal lights therefor in the signal board 120, thereby visually and quickly indicating the existence of a malfunctioning drill head in order that service personnel may replace the same.

Figure 8:
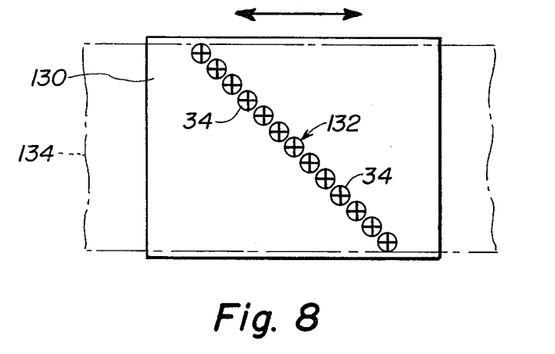
FIG. 8 is a fragmentary diagrammatic plan view showing a pattern of drill heads mounted for a milling or planing operation.
Figure 9:
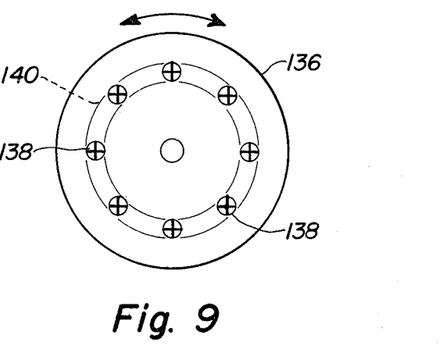
FIG. 9 is a diagrammatic pattern of a circular arrangement of drill heads adapted to be moved about an axis to effect a circular cut in a workpiece.

Referring to FIGS. 8 and 9, additional types of operation embodying patterns of powered drill heads are illustrated therein. For example, in FIG. 8, by providing a head 130, supported by suitable mechanism, such as a milling machine or the like, it is possible to mount a diagonal row 132 of drill heads 34 thereon, and move the head 130 either in one direction or reciprocate the same in opposite directions, as indicated by the arrow shown in said figure. For purposes of having cutting bits, such as end mills, rotated by said row of drill heads to effect a planing operation upon a flat workpiece 134, for example, it will be understood that the row 132 of drill heads can be at such an angle with respect to the direction of movement of the head 130 that the cutting ends of all of the end mills will be in a common plane and will supplement each other to make a complete cut across the width of the workpiece 134, for example, similar to that of a planing machine or otherwise, especially if only a light cut is to be made.

As shown in FIG. 9, a circular head 136 may be provided with a circular pattern of drill heads to support a plurality of end mills 138, for example, the cutting ends of which are all disposed in a common plane, and by rotating the heads 136, either in a single direction or reciprocating the same in opposite circular directions, the end mills are capable of cutting either a circular groove 140, shown in dotted lines in FIG. 9, or particularly in working with sheet material, such arrangement may be employed to cut holes in or discs from a workpiece sheet. Therefore, the exemplary illustrations in FIGS. 8 and 9 serve to illustrate the versatility of such an arrangement of drill heads preferably supported by mounting heads and the like, illustrated in exemplary manner in FIGS. 8 and 9, to perform operations other than merely drilling holes in workpieces and in which, preferably, the supporting heads are formed in a manner described above with respect to forming the support plates 22 for operation with the exemplary machine system illustrated in FIG. 16. For such operations, either the support for the drill heads may be moved relative to the workpiece or vice versa.

HOLE DRILLING OF SUPPORT PLATES

The partial patterns of holes formed in accordance with the invention in the various plates and the like, such as base plates 18, support plates 22 for holding drill heads 34, and support plates 44 for the detecting heads 46, conveniently may be produced by the use of single or multi-spindle numerically-controlled drilling machines using a perforated tape. A suitable procedure to form such tapes and, thereafter, the various plates referred to above is as follows:

A pattern sheet of paper or otherwise upon which is printed or photographed a pattern of holes to be produced in the finished product sheets 10 is used as a basis to select and produce the various partial patterns respectively produced on such plates to form a complete set thereof. This sheet may be a drawing of a printed electrical circuit of a printed circuit board in which a complete pattern of drilled holes are to be produced. The holes, for example, may be illustrated either as dots or small circles. An exemplary type of pattern of such exemplary printed circuit is illustrated in FIG. 1, in which the pattern 12 is shown, as described hereinabove. Such printed sheet is placed upon a suitable sheet of non-metallic material, for example, and sufficiently yeildable to be susceptible to being penetrated by sharp objects. Plywood is highly suitable, but other forms of wood, bonded fiber material of which one type is sold under the trademark "Cellotex", or any other type of building material or the like, having such characteristics may be used. The small circular holes 14 of the pattern shown in FIG. 1 represent holes into which certain contacts or components of electrical elements are to be inserted in the finished printed circuit board and assembly. In accordance with this aspect of the invention, it is contemplated that a plurality of plug-like members 148 made of metal, plastic material, or any other appropriate substance, are illustrated in various types respectively in FIGS. 10-12 and have a diameter no less than that of the powered drill heads 34. In FIG. 12, the plug-like member 150 is different in shape and contour from the members 148, shown respectively in FIGS. 10 and 11, for purposes described hereinafter.

The plug-like members 148 and 150 each have an appendage extending axially from one end thereof. The various embodiments of plugs shown in FIGS. 10-12 have appendages of alternate types in which, in FIGS. 10 and 12, the appendage 152 preferably is a relatively slim needle-like member somewhat resembling a phonograph needle and is readily capable of penetrating through a selected circular configuration 146 of the printed circuit pattern 12. By application of reasonable force, the appendage penetrates the exemplary non-metallic sheet described, which is of a yieldable nature. Such penetration preferably is for the full extent of the appendage 152 in order to firmly position the plug-like member 148 upon the upper surface of the yieldable sheet and the plug abuts the pattern on the paper sheet or photograph thereof.

It will be understood that in accordance with the foregoing description, especially pertaining to FIGS. 13 and 14, which are of exemplary nature, that a plurality of the plugs 148 will be applied to the pattern sheet and yieldable supporting sheet by impinging the same through the circular configurations 146 in such an arrangement that the plugs do not interfere with each other. As a result of this, when drill heads 34 are mounted upon the support plates 22, for example, there will be sufficient clearance on the plate between the heads to accommodate a substantial number of the heads comprising a partial pattern of the entire pattern of holes to be drilled.

After a full complement of one selected partial pattern of plug-like members 148 of the entire pattern of holes has been placed upon the pattern sheet, the plugs are removed and the holes formed in the pattern sheet then are digitized by a scanning head of a conventional tape-forming machine for use with a numerically controlled, spindle-type automatic drilling machine to form a duplicate pattern of holes, for example, in the base plates 18 and support plates 22 and 44, it being understood that the drilling machine will be fitted with drill bits of appropriate diameter to form the desired diameter of holes in such plates.

Figure 10:
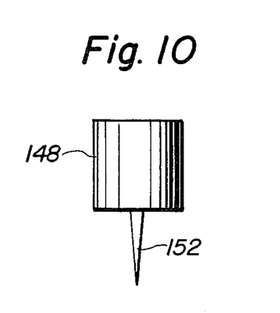
FIGS. 10, 11 and 12 show side elevations of different types of plugs and points thereon used in relation to the invention.
Figure 11:
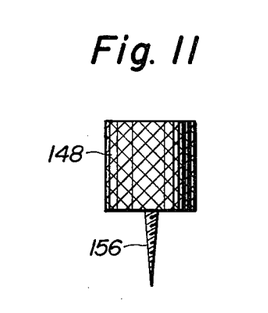
Figure 12:
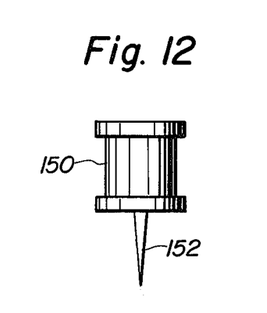

In the various embodiments of plug-like members illustrated in FIGS. 10-12, the appendage 156 on plug 148 in FIG. 11 is tapered and threaded and the plug 148 preferably is knurled or roughened to facilitate manipulating the threaded point into the yieldable sheet beneath the pattern sheet, for example.

The foregoing procedure is used to make a full set of partial patterns of holes to be drilled and digitizing them successively upon one or more tapes in a conventional tape producing machine. Two exemplary partial patterns of holes are shown in FIGS. 13 and 14 by placing suitable plugs of the types shown in FIGS. 10-12 on the paper patterns to provide clearance for the drill heads 34, for example, on the support plates 22 when drilled to receive the supporting shafts 32. Then, by using the perforated tapes formed for a complete set of partial patterns of the entire pattern, complete sets respectively of base plates 18 with clearance holes therein of suitable diameter, support plates 22 with the holes for shafts 24 and 32 therein, and test equipment support plates 44 with the holes therein to support detecting heads therein, may be produced automatically from the same tapes and the sets of such support plates with the equipment mounted therein then may be mounted upon the conveyor 90 and reciprocating frame 104 to produce product sheets of material, such as printed circuit boards 10, or otherwise, at far less cost then by systems and processes now used commercially and industrially.

This application is companion to a somewhat related invention comprising the subject matter of U.S. Patent Application, Ser No. 231,341, filed on even date herewith.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

What is claimed is:

1. Mechanism for forming product sheets of rigid material having a pattern of holes uniformly formed therein comprising in combination:
    (a) a pattern sheet containing an entire pattern of locations for holes to be formed in said sheets,
    (b) a plurality of plug-like members having a diameter at least equal to the diameter of powered tool heads to be used to form said holes in gang multiple head manner in said product sheets and provided with a central sharp projection on one end thereof adapted to be positioned on selected locations of holes of said pattern sheet without interference between any of the members for at least pricking said pattern sheet at selected hole locations on said sheet to form sets of partial patterns of holes, a series of sets of partial patterns of holes comprising the entire pattern thereof on said pattern sheet,
    (c) a perforated tape for a numerically controlled drilling machine on which the locations of said sets of partial patterns of holes are digitized for use in a numerically controlled drilling machine, and operable to drill respectively on a set of rigid support plates partial patterns of attachment holes,
    (d) a plurality of powered tool heads of uniform diameter,
    (e) means to connect said tool heads to said patterns of attachment holes in said support plates to form a set of patterned gangs of tool heads on said plates,
    (f) base plates to support one or more product sheets of material,
    (g) a series of reciprocable machine heads respectively adapted to support and reciprocate said series of patterned gangs of tool heads, and
    (h) means to move said base plates with product sheets thereon sequentially beneath said machine heads to have partial patterns of holes machined therein ultimately to form complete patterns of holes in said product sheets.

2. The mechanism according to claim 1 in which said powered tool heads comprise fluid-operated turbines, and including means to connect a supply of operating fluid under pressure to said tool heads.

3. The mechanism according to claim 1 in which said means to connect said tool heads to said support plates comprise shafts extending from the normally upper ends of said powered tool heads and said shafts extending through said attachment holes in said support plates and detachably secured thereto.

* * * * *